United States Patent [19]
Lechner et al.

[11] Patent Number: 4,651,110
[45] Date of Patent: Mar. 17, 1987

[54] CIRCUIT ARRANGEMENT FOR ZERO POINT BALANCING OF AN INTEGRATED OPERATIONAL AMPLIFIER

[75] Inventors: Robert Lechner, Otterfing, Fed. Rep. of Germany; David Sealer, Austin, Tex.

[73] Assignees: Advanced Micro Devices, Inc., Sunnyvale, Calif.; Siemens Aktiengesellschaft, Berlin and Munich, Fed. Rep. of Germany

[21] Appl. No.: 779,513

[22] Filed: Sep. 24, 1985

[30] Foreign Application Priority Data

Sep. 26, 1984 [DE] Fed. Rep. of Germany ....... 3435321

[51] Int. Cl.⁴ .............................................. H03F 1/00
[52] U.S. Cl. ......................................... 330/9; 330/51; 307/491

[58] Field of Search ...................... 330/9, 51; 307/491; 328/162, 165

[56] References Cited

U.S. PATENT DOCUMENTS 4,429,282  1/1984  Saari ........................................ 330/9

Primary Examiner—James B. Mullins
Attorney, Agent, or Firm—Hill, Van Santen, Steadman & Simpson

[57] ABSTRACT

In a zero point balancing system employing a balance capacitor switched by means of semiconductor switches, balancing errors due to parasitic capacitance of these switches, as well as due to picked up interferences at the output of the operational amplifier, are avoided with the assistance of an RC element connected in a defined fashion.

14 Claims, 1 Drawing Figure

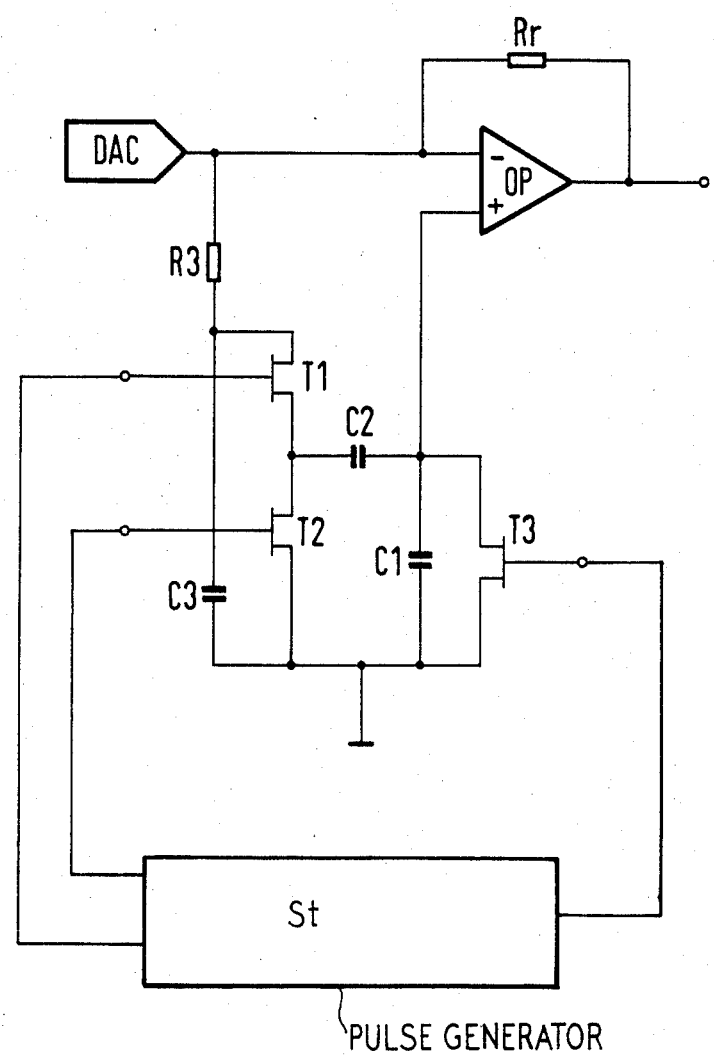

CIRCUIT ARRANGEMENT FOR ZERO POINT BALANCING OF AN INTEGRATED OPERATIONAL AMPLIFIER

BACKGROUND OF THE INVENTION

The invention relates to a circuit arrangement for zero point balancing of an integrated operational amplifier having a feedback resistor connected at its inverting input. The circuit has a null balance capacitor which, by means of corresponding actuation of semiconductor switches, is respectively inserted during a balancing phase into a circuit branch lying between the inverting input of the operational amplifier and a circuit point carrying reference potential, and during a following operating phase upon polarization reversal is applied between this reference potential point and the non-inverting input of the operational amplifier.

With a circuit arrangement of this type, it is possible to compensate the offset error of operational amplifiers such that a zero potential is present at the inverting differential amplifier input of the operational amplifier. Nonetheless, an output voltage is emitted by the zero point balancing circuit. This output voltage deviates from zero and its magnitude corresponds to what is referred to as an offset voltage.

With the known circuit arrangement cited above, a null balance capacitor is pre-charged via a feedback branch during a balancing phase to such a degree that, in the following operating phase in which the capacitor is applied to the other amplifier input given a change of polarization, it compensates the offset voltage or the corresponding zero point error.

When semiconductor switches are employed for the switch-over between the balancing phase and the operating phase, then the precision of the compensation achieved in such fashion is diminished due to the influence of parasitic capacitances of at least one of these switches which falsify the charge of the null balance capacitor. An increase in the capacitance of the null balance capacitor to such a degree that this effect is negligible would lead to overall structural sizes which are not practical in the context of integrated circuits.

The described charging of the null balance capacitor usually occurs periodically and during a respective timespan which is short in comparison to the operating time phase. Since the offset voltage is not a constant quantity, the result is that the null balance capacitor may pick up charges under certain conditions which do not correspond to the interference conditions over the entire operating phase. This is the source of a further imprecision of this compensation circuit.

Over and above this, one must also count on interference pick-up at the output of the operational amplifier. This likewise influences the charging of the balance capacitor via the feedback path, and thus also contributes to the fact that the compensation does not have the desired precision.

Disturbances which are coupled in on the grounded line of such a circuit arrangement have a similar effect. During the transition from the balancing phase into the operating phase, a discontinuity of the output voltage of the operational amplifier occurs given the known circuit arrangement. This likewise is undesirable.

SUMMARY OF THE INVENTION

It is an object of the present invention to improve a circuit arrangement for zero point compensation of the aforementioned type such that the occurring imprecisions and interferences are largely eliminated.

This is achieved in accordance with the invention in that an RC element is permanently connected between the inverting input of the operational amplifier and the reference potential point. The resistor of the RC element is connected at the inverting operational amplifier input, and the capacitor is connected between the resistor and the reference potential point. The resistor of the RC element and the capacitor connected to the non-inverting input, are elements of the circuit branch to which the null balance capacitor is connected via a field effect transistor in the zero balancing phase.

Fast changes in offset voltage are largely attenuated by the RC element provided in accordance with the invention. Interfering influences which change slowly are averaged over a plurality of balancing phases by the mean value formation determined by the ratio of the capacitances of the null balance capacitor and the permanently connected capacitor lying between the inverting input and the reference potential point.

In accordance with a further development of the invention, two semiconductor switches have their main current paths connected in series and connected between the junction of the resistor and the capacitor of the RC element and the reference potential point. These two switches are provided in order to initiate the turn-on and switch-over operations. These semiconductor switches are as similar as possible with respect to their internal structure, their connection wiring, and the time duration and relative position of their drive pulses. In this case the influence of parasitic capacitances of the semiconductor switches is reduced to an even greater degree.

In another embodiment of the invention, a semiconductor switch is activated during the turn-on operation. The main current path of this semiconductor switch is connected parallel to the capacitor permanently connected between the non-inverting input of the operational amplifier and the reference potential point. With the assistance of this switch, thus a charge which may still be potentially situated on the capacitor is cancelled, so that the charging of the null balance capacitor in the new balancing phase is independent of the previous history of the circuit arrangement.

BRIEF DESCRIPTION OF THE DRAWINGS

The drawing FIGURE illustrates the circuit arrangement for zero point balancing according to the invention.

DESCRIPTION OF THE PREFERRED EMBODIMENTS

The operational amplifier whose zero point balance is to be undertaken with the assistance of the circuit arrangement of the invention is referenced OP in the FIGURE. The inverting input of this operational amplifier is charged with an input signal by a digital-to-analog converter DAC in the illustrated example. The output of the operational amplifier is connected to the inverting input via a feedback resistor R.

An RC element is connected between the inverting input and a circuit point (ground) carrying reference potential. This RC element is formed of a high-impedance resistor R3 (for example, 100 kOhm) which can be formed by a field effect transistor. One end of the resistor connects at the inverting input of the operational amplifier and its other end connects to a capacitor C3 which in turn connects at its other end to the reference potential point. A capacitor C1 is permanently connected between the non-inverting input of the operational amplifier and the reference potential point.

A capacitor C2, which is the actual null balance capacitor, connects between the non-inverting input of the operational amplifier and the junction of the resistor R3 and the capacitor C3 via a semiconductor switch T1.

The one end of the capacitor, which can be connected to the resistor R3 via the semiconductor switch T1, can also be connected to the reference potential point via a second semiconductor switch T2.

The capacitor C1 can be bridged by a further semiconductor switch T3. The values of capacitance of the capacitors are, for example C1=10 pF, C2=1 pF, and C3=10 pF.

The operating mode of the illustrated circuit arrangement shall also be briefly discussed below.

When the circuit arrangement is placed in operation, the semiconductor switch T3 is first closed by control pulses from pulse generator St, so that a potential charge of the capacitor C1 can flow off. In the course of a balancing phase, particularly given operation in combination with a digital-to-analog converter of a PCM system, the semiconductor switch T1 is closed by application of a control pulse from drive pulse generator St at periodic intervals of 125 μs. It is closed, for example, for 4 μs. The semiconductor switches T2 and T3 are opened during this timespan. Via the feedback resistor Rr and via the RC element R3/C3, the balance capacitor will therefore charge proceeding from the output of the operational amplifier in accordance with the offset voltage. The RC element sees to it that voltage peaks are attenuated.

In the following operating phase, the semiconductor switch T1 is open but the semiconductor switch T2 is closed, so that, given reversal of polarization, the charged null balance capacitor C2 lies between the reference potential point and the non-inverting input of the operational amplifier. Thus the offset voltage is compensated, i.e. only a negligibly small output voltage is present at the operational amplifier output when the digital-to-analog converter does not supply an input voltage for the operational amplifier. Since the effective compensation voltage is averaged in the ratio of the capacitance values C1:C2 over a plurality of such balancing/operating phases, interfering influences which change slowly are largely disabled.

A further improvement can be achieved in that the balancing phase is not allowed to occur cyclically, but rather in accordance with a random sequence.

As already indicated, the influences of parasitic capacitances of the semiconductor switches, particularly of the semiconductor switch T2 connecting the null balance capacitor to the reference potential point, are kept particularly small when the semiconductor switches T1 and T2 are identical or symmetrical in structure, in other words, with respect to their size and crystal orientation, as well as with respect to their connection wiring. The same also applies to the drive pulses for the actuation of these semiconductor switches. Their chronological position and time duration must correspond.

Although various minor changes and modifications might be proposed by those skilled in the art, it will be understood that we wish to include within the claims of the patent warranted hereon all such changes and modifications as reasonably come within our contribution to the art.

We claim as our invention:

1. A circuit arrangement for zero point balancing of an integrated operational amplifier having a non-inverting input and a feedback resistor from its output to its inverting input, comprising:
   a null balance capacitor as a first capacitor;
   semiconductor switch means for connecting the null balance capacitor during a balancing phase into a circuit branch connecting between the inverting input of the operational amplifier and a reference potential, and during a following operating phase for connecting the null balance capacitor between the reference potential and the non-inverting input of the operational amplifier so that a reversal of polarization of current flowing in the null balance capacitor occurs;
   a RC element having a resistor connected at the inverting input and a second capacitor, the RC element being connected at the other end to the reference potential;
   a third capacitor connected between the non-inverting input of the operational amplifier and the reference potential; and
   the circuit branch into which the null balance capacitor is switched comprising a resistor of the RC element and the third capacitor connecting to the non-inverting input.

2. A circuit arrangement according to claim 1 wherein said semiconductor switch means comprises first and second semiconductor switches having their main current paths connected in series, the current paths being connected between a junction of the resistor and the second capacitor of the RC element and the reference potential, drive pluse means also being provided for supplying drive pulses to the first and second switches, and the first and second switches being substantially identical to one another with respect to their internal structure.

3. A circuit arrangement according to claim 1 wherein a semiconductor switch is connected such that its main current path is connected parallel to the third capacitor.

4. A circuit arrangement according to claim 1 wherein a drive means is connected to the semiconductor switch means such that the balancing phase is periodically repeated.

5. A circuit arrangement according to claim 1 wherein a drive means is connected to the semiconductor switch means such that the balancing phase is repeated in accordance with a random sequence 6. An integrated operational amplifier circuit having zero point balancing, comprising:
   an operational amplifier having an output, a non-inverting input, and an inverting input and wherein a feedback resistance is provided between the output and the inverting input;
   a series RC circuit comprising a first resistor and first capacitor connected between the inverting input and a reference potential;
   first and second series connected semiconductor switches connecting between a junction of the first resistor and first capacitor, and the reference potential;
   a null balance capacitor connecting between a junction of the first and second switches and a second capacitor connecting to the reference potential; and the non-inverting input of the operational amplifier connecting to the null balancing capacitor at a side opposite the connection to the first and second switches.

7. A circuit arrangement according to claim 6 wherein the second capacitor has a capacitance substantially greater than a capacitance of the null balance capacitor.

8. A circuit arrangement according to claim 6 wherein a third semiconductor switch is connected parallel to the second capacitor.

9. A circuit arrangement according to claim 6 wherein drive means are provided for periodically turning on the first semiconductor switch connected between the null balance capacitor and first resistor for a portion of time substantially less than the overall period between first switch turn-ons.

10. A circuit arrangement according to claim 6 wherein drive means are connected to the first and second switches for closing the first semiconductor switch for a predetermined time at periodic intervals and for opening the second semiconductor switch and then in a following operating phase opening the first semiconductor switch and closing the second semiconductor switch.

11. A circuit arrangement according to claim 10 wherein a drive means is provided for closing the third semiconductor switch, and then during a balancing phase closing the first semiconductor switch and opening the second and third semiconductor switches.

12. A circuit arrangement according to claim 6 wherein a digital-to-analog converter has its output connected to the inverting input of the operational amplifier and wherein drive means are connected to the first and second switches such that during a balancing phase the first semiconductor switch is closed and the second switch is open, and in a following operating phase the first switch is open and the second switch is closed so that the null balance capacitor is connected between the reference potential and the non-inverting input of the operational amplifier.

13. A method for zero point balancing of an integrated operational amplifier wherein an RC element is connected between an inverting input of the operational amplifier and a reference potential, first and second series connected semiconductor switches are provided between a junction of a resistor and capacitor of the RC element and a reference potential, and wherein a null balance capacitor connects between a junction of the first and second switches and a junction of a further capacitor and a non-inverting input of the operational amplifier, the further capacitor connecting to reference potential, comprising the steps of:

first closing the first semiconductor switch for a given time period so that the null balance capacitor is connecting through the RC element resistor to the inverting input of the operational amplifier; and thereafter closing the second semiconductor switch and opening the first semiconductor switch so that the null balance capacitor is connected between the reference potential and the non-inverting input of the operational amplifier.

14. A method according to claim 13 including the steps of charging the null balance capacitor during a balancing phase, and then in a following operating phase connecting the charged null balance capacitor between the reference potential and the non-inverting input of the operational amplifier.

* * * * *